(12) United States Patent
Chaya et al.

(10) Patent No.: US 6,667,907 B2
(45) Date of Patent: Dec. 23, 2003

(54) SEMICONDUCTOR MEMORY AND METHOD FOR APPLYING VOLTAGE TO SEMICONDUCTOR MEMORY DEVICE

(75) Inventors: Shigeo Chaya, Shiga (JP); Masanori Matsuura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/395,193

(22) Filed: Mar. 25, 2003

(65) Prior Publication Data

US 2003/0185069 A1 Oct. 2, 2003

(30) Foreign Application Priority Data

Mar. 26, 2002 (JP) .......................... 2002-086706

(51) Int. Cl.[7] .............................................. G11C 11/34
(52) U.S. Cl. .................................. 365/185.18; 365/194
(58) Field of Search ............................ 365/185.18, 194

(56) References Cited

U.S. PATENT DOCUMENTS 5,600,274 A * 2/1997 Houston ...................... 327/262
6,169,307 B1   1/2001 Takahashi et al. ............ 257/315
6,366,507 B1 * 4/2002 Akioka et al. ................ 365/194
6,538,933 B2 * 3/2003 Akioka et al. ................ 365/194

FOREIGN PATENT DOCUMENTS

JP            7-30076         1/1995

* cited by examiner

Primary Examiner—Mike Tran
(74) Attorney, Agent, or Firm—McDermott, Will & Emery

(57) ABSTRACT

The semiconductor memory of this invention includes a memory cell, a control word line selector/deriver circuit, a well driver circuit, a source line selector/deriver circuit, a pulse generation circuit for outputting a pulse signal in injecting electrons into a floating gate of the memory cell, a first delay circuit, a second delay circuit and a third delay circuit. The control word line selector/deriver circuit changes the potential of a control word line in response to a first delay signal received from the first delay circuit, the well driver circuit changes the potential of a well in response to a second delay signal received from the second delay circuit, and the source line selector/deriver circuit changes the potential of a source line in response to a third delay signal received from the third delay circuit.

6 Claims, 7 Drawing Sheets

(DATA WRITE OPERATION)

(DATA ERASE OPERATION)

(DATA WRITE OPERATION)

(DATA ERASE OPERATION)

SEMICONDUCTOR MEMORY AND METHOD FOR APPLYING VOLTAGE TO SEMICONDUCTOR MEMORY DEVICE

BACKGROUND OF THE INVENTION

The present invention relates to a semiconductor memory and a method for applying a voltage to a semiconductor memory device.

In accordance with recent spread of portable equipment and requests for energy saving and reduction of waste, there are increasing demands for a semiconductor device including a nonvolatile memory that is rewritable and capable of storing data even with power off. Examples of the semiconductor nonvolatile memory are a flash memory and a ferroelectric memory, both of which have their own advantages and disadvantages and are characteristic in applied fields of products. For example, a flash memory is suitably applied to attain a large capacity because it has a small memory cell size but it is disadvantageous in a small number of times for rewriting data therein (hereinafter referred to as the rewrite number). On the other hand, a ferroelectric memory is advantageous in a large rewrite number but is not suitably used to attain a large capacity because it has a large memory cell size. An EEPROM is a compromise between a flash memory and a ferroelectric memory in both the memory cell size and the rewrite number.

FIG. 8 shows an exemplified conventional flash memory and is a cross-sectional view of a 1-bit memory cell 80 including two transistors.

The memory cell 80 of FIG. 8 includes a floating gate 801, a tunnel oxide film 802, an interlayer film 803 of ONO or the like, a control gate 804 connected to a control word line, a gate 805 connected to a select word line, a P well 806, a source 807 connected to a source line, a drain 808 connected to a data line, a thin N-type diffusion layer 809 and an N well 810.

FIG. 9 shows an exemplified architecture of a circuit used for operating the flash memory 80 of FIG. 8.

The circuit of FIG. 9 includes a power circuit 901 for generating predetermined positive and negative voltages, a timing control circuit 902 for controlling timing of applying a voltage, a data line selector/deriver circuit 903 for selecting and driving a data line, a select word line selector/deriver circuit 904 for selecting and driving a select word line, a control word line selector/deriver circuit 905 for selecting and driving a control word line, a source line selector/deriver circuit 906 for selecting and driving a source line, and a well driver circuit 907 for driving a well.

FIG. 10 is a block diagram for explaining the architecture of the timing control circuit 902 of FIG. 9, and more particularly, a timing control circuit 902A used in writing data.

The timing control circuit 902A of FIG. 10 includes a pulse generation circuit 1001 for generating a predetermined write pulse from a basic clock, and delay circuits 1002, 1003 and 1004 for providing predetermined delays respectively to the activations of the aforementioned selector/deriver circuits 907, 905 and 906. As shown in FIG. 10, the well driver circuit 907 is connected to the timing control circuit 902A so as to receive a signal from the delay circuit 1002, the control word line selector/deriver circuit 905 is connected thereto so as to receive a signal from the delay circuit 1003, and the source line selector/deriver circuit 906 is connected thereto so as to receive a signal from the delay circuit 1004.

In a data write operation, first, the well driver circuit 907 receives a signal from the delay circuit 1002 and is activated with the predetermined delay from a write pulse so as to apply a predetermined voltage to the P well 806. The control word line selector/deriver circuit 905 receives a signal from the delay circuit 1003 and is activated with the predetermined delay from the signal so as to apply a predetermined voltage to the control word line. Furthermore, the source line selector/deriver circuit 906 receives a signal from the delay circuit 1004 and is activated with the predetermined delay from the signal so as to apply a predetermined voltage to the source line. In this manner, data is written in the memory cell 80.

FIG. 11 is a block diagram for explaining the architecture of the timing control circuit 902 of FIG. 9, and more particularly, a timing control circuit 902B used in erasing data.

The timing control circuit 902B of FIG. 11 includes a pulse generation circuit 1005 for generating a predetermined erase pulse from a basic clock, and delay circuits 1006 and 1007 for providing predetermined delays respectively to the activations of the aforementioned selector/deriver circuits 907 and 905. As shown in FIG. 11, the well driver circuit 907 is connected to the timing control circuit 902B so as to receive a signal from the delay circuit 1006 and the control word line selector/deriver circuit 905 is connected thereto so as to receive a signal from the delay circuit 1007.

In an erase operation, first, the well driver circuit 907 receives a signal from the delay circuit 1006 and is activated with the predetermined delay from an erase pulse so as to apply a predetermined voltage to the P well 806. The control word line selector/deriver circuit 905 receives a signal from the delay circuit 1007 and is activated with the predetermined delay from the signal so as to apply a predetermined voltage to the control word line. In this manner, data is erased from the memory cell 80.

FIG. 12 is a diagram for showing operation timings and polarities of the respective signal lines employed in writing data in the memory cell 80, namely, in injecting electrons into the floating gate 801.

In the case where electrons are injected into the floating gate 801 via the tunnel oxide film 802, as shown in FIG. 12, negative potential is first applied to the P well 806 at timing 12a, positive potential is applied to the control word line at timing 12b, and then, negative potential is applied to the source line at timing 12c. In this case, the select word line is kept at 0 V.

FIG. 13 is a diagram for showing operation timings and polarities of the respective signal lines employed in erasing data from the memory cell 80, namely, in extracting electrons from the floating gate 801.

In the case where electrons are extracted from the floating gate 801 via the tunnel oxide film 802, as shown in FIG. 13, positive potential is first applied to the P well 806 at timing 13a, and then negative potential is applied to the control word line at timing 13b. In this case, the data line and the source line are opened and the select word line is kept at power potential.

In this manner, the data write operation and the data erase operation are performed.

In the case where data is written as shown in FIG. 12, however, a large peak electric field is applied to the tunnel oxide film 802 in a moment when the potential of the source line becomes negative. Therefore, the quality of the tunnel oxide film 802 is degraded, and hence, the rewrite number is reduced and the data storage characteristic is degraded. As a result, the reliability is disadvantageously lowered.

Also, in the case where data is erased as shown in FIG. 13, a large peak electric field is applied to the tunnel oxide film 802 in the reverse direction to that applied in the data write operation in a moment when the potential of the control word line becomes negative. Therefore, the quality of the tunnel oxide film 802 is degraded, and hence, the rewrite number is reduced and the data storage characteristic is degraded. As a result, the reliability is disadvantageously lowered.

SUMMARY OF THE INVENTION

An object of the invention is providing a semiconductor memory and a method for applying a voltage to a semiconductor memory device in which reduction of the rewrite number and degradation of the data storage characteristic can be avoided by preventing a peak electric field from being applied to a tunnel oxide film.

In order to overcome the aforementioned disadvantages, the first semiconductor memory of this invention includes a semiconductor memory device including a first transistor and a second transistor formed on a well, the first transistor having a tunnel oxide film, a floating gate, a drain, a source connected to a source line and a control gate connected to a control word line, the second transistor having a source, a drain connected to a data line and a gate connected to a select word line, and the drain of the first transistor being connected to the source of the second transistor; a first pulse generation circuit for outputting a pulse signal in injecting electrons into the floating gate of the first transistor, a first delay circuit for receiving the pulse signal from the first pulse generation circuit and outputting a first delay signal by delaying the pulse signal; a second delay circuit for receiving the first delay signal from the first delay circuit and outputting a second delay signal by delaying the first delay signal; a third delay circuit for receiving the second delay signal from the second delay circuit and outputting a third delay signal by delaying the second delay signal; a control word line driver circuit for changing potential of the control word line to a given voltage in response to the first delay signal received from the first delay circuit; a well driver circuit for changing potential of the well to a given voltage in response to the second delay signal received from the second delay circuit; and a source line driver circuit for changing potential of the source line to a given potential in response to the third delay signal received from the third delay circuit.

In the first semiconductor memory, an excessive electric field such as a peak electric field can be prevented from being applied to the tunnel oxide film in injecting electrons into the floating gate of the semiconductor memory device. Therefore, degradation of the tunnel oxide film can be prevented, and reduction of the rewrite number and degradation of the data storage characteristic can be avoided. As a result, the reliability can be improved.

The second semiconductor memory of this invention includes a semiconductor memory device including a first transistor and a second transistor formed on a well, the first transistor having a tunnel oxide film, a floating gate, a drain, a source connected to a source line and a control gate connected to a control word line, the second transistor having a source, a drain connected to a data line and a gate connected to a select word line, and the drain of the first transistor being connected to the source of the second transistor; a second pulse generation circuit for outputting a pulse signal in extracting electrons from the floating gate of the first transistor; a fourth delay circuit for receiving the pulse signal from the second pulse generation circuit and outputting a fourth delay signal by delaying the pulse signal; a fifth delay circuit for receiving the fourth delay signal from the fourth delay circuit and outputting a fifth delay signal by delaying the fourth delay signal; a control word line driver circuit for changing potential of the control word line to a given voltage in response to the fourth delay signal received from the fourth delay circuit; and a well driver circuit for changing potential of the well to a given voltage in response to the fifth delay signal received from the fifth delay circuit.

In the second semiconductor memory, an excessive electric field such as a peak electric field can be prevented from being applied to the tunnel oxide film in extracting electrons from the floating gate of the semiconductor memory device. Therefore, the degradation of the tunnel oxide film can be prevented, and the reduction of the rewrite number and the degradation of the data storage characteristic can be avoided. As a result, the reliability can be improved.

In the first or second semiconductor memory, the gate of the second transistor is preferably a first gate interconnect layer that is formed simultaneously with and from an identical interconnect layer with the floating gate of the first transistor.

In the first or second semiconductor memory, the gate of the second transistor is preferably obtained by connecting a first gate interconnect layer to a second gate interconnect layer, the first gate interconnect layer being formed simultaneously with and from an identical interconnect layer with the floating gate of the first transistor, and the second gate interconnect layer being formed simultaneously with and from an identical interconnect layer with the control gate of the first transistor.

The first method of this invention for applying a voltage to a semiconductor memory device, which includes a first transistor that is formed on a well and has a tunnel oxide film, a floating gate, a drain, a source connected to a source line and a control gate connected to a control word line; and a second transistor that is formed on the well and has a source, a drain connected to a data line and a gate connected to a select word line, the drain of the first transistor being connected to the source of the second transistor, includes, for injecting electrons into the floating gate of the first transistor, a first step of changing potential of the control word line to a given voltage; a second step of changing potential of the well to a given voltage after changing the potential of the control word line in the first step; and a third step of changing potential of the source line to a given voltage after changing the potential of the well in the second step.

In the first method for applying a voltage to a semiconductor memory device, an excessive electric field such as a peak electric field can be prevented from being applied to the tunnel oxide film in injecting electrons into the floating gate of the semiconductor memory device. Therefore, the degradation of the tunnel oxide film can be prevented, and the reduction of the rewrite number and the degradation of the data storage characteristic can be avoided. As a result, the reliability can be improved.

The second method of this invention for applying a voltage to a semiconductor memory device, which includes a first transistor that is formed on a well and has a tunnel oxide film, a floating gate, a drain, a source connected to a source line and a control gate connected to a control word line; and a second transistor that is formed on the well and has a source, a drain connected to a data line and a gate connected to a select word line, the drain of the first transistor being connected to the source of the second transistor, includes, for extracting electrons from the floating gate of the first transistor, a fourth step of changing potential of the control word line to a given voltage; and a fifth step of changing potential of the well to a given voltage after changing the potential of the control word line in the fourth step.

In the second method for applying a voltage to a semiconductor memory device, an excessive electric field such as a peak electric field can be prevented from being applied to the tunnel oxide film in extracting electrons from the floating gate of the semiconductor memory device. Therefore, the degradation of the tunnel oxide film can be prevented, and the reduction of the rewrite number and the degradation of the data storage characteristic can be avoided. As a result, the reliability can be improved.

DETAILED DESCRIPTION OF THE INVENTION

A preferred embodiment of the invention will now be described with reference to the accompanying drawings.

Figure 1:
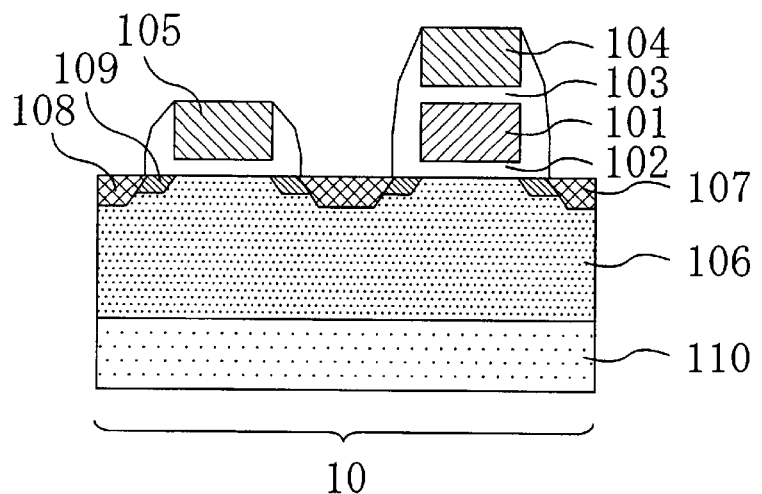
FIG. 1 is a cross-sectional view of a memory cell according to an embodiment of the invention.

FIG. 1 is a cross-sectional view of a 1-bit memory cell (semiconductor memory device) 10 including two transistors (respectively corresponding to first and second transistors) described as an example of a semiconductor memory according to this embodiment.

The memory cell 10 of FIG. 1 includes a floating gate 101, a tunnel oxide film 102, an interlayer film 103 of ONO or the like, a control gate 104 connected to a control word line, a gate 105 connected to a select word line, a P well 106, a source 107 connected to a source line, a drain 108 connected to a data line, a thin N-type diffusion layer 109 and an N well 110.

Figure 2:
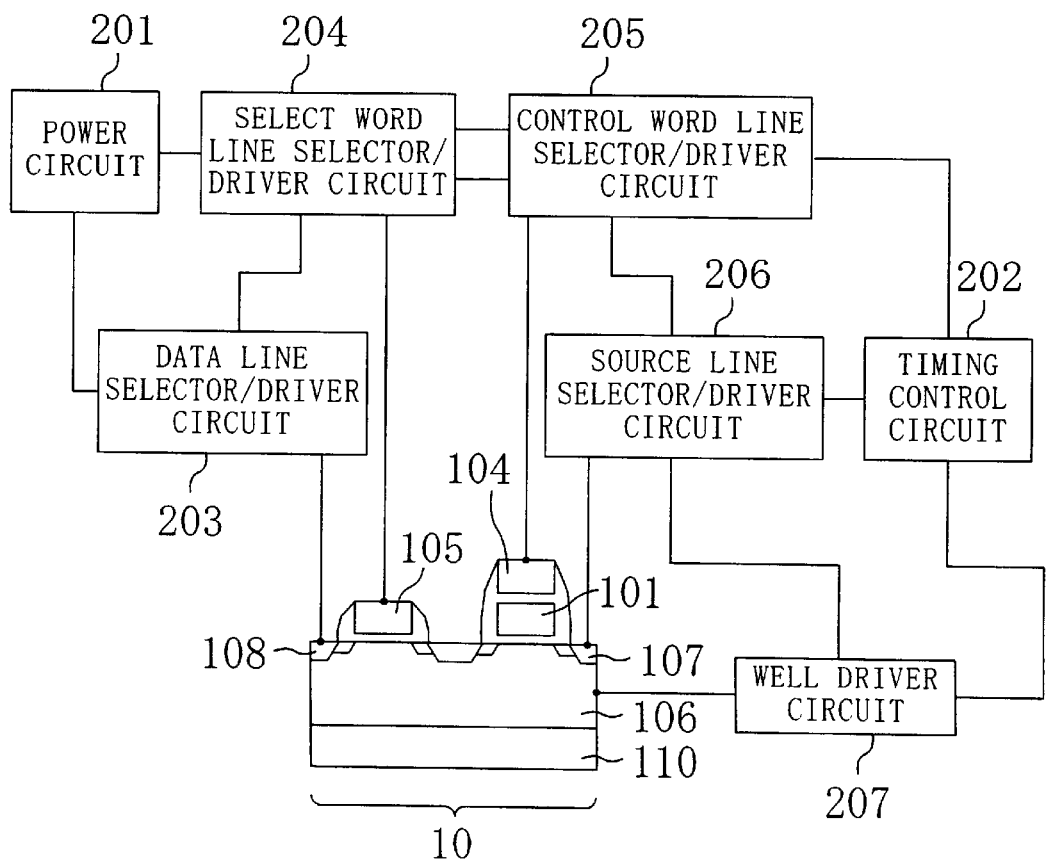
FIG. 2 is a diagram for showing an exemplified circuit used for operating the memory cell.

FIG. 2 shows an exemplified architecture of a circuit used for operating the memory cell 10 of FIG. 1.

The circuit of FIG. 2 includes a power circuit 201 for generating predetermined positive and negative voltages, a timing control circuit 202 for controlling timing of applying a predetermined voltage, a data line selector/deriver circuit 203 for selecting and driving a data line, a select word line selector/deriver circuit 204 for selecting and driving a select word line, a control word line selector/deriver circuit 205 (corresponding to a control word line driver circuit) for selecting and driving a control word line, a source line selector/deriver circuit 206 (corresponding to a source line driver circuit) for selecting and driving a source line, and a well driver circuit 207 for driving a well. The driving power of the well driver circuit is suppressed to be low in order to charge the capacity of the well.

Now, a data write operation and a data erase operation of the memory cell will be described separately.

<Data Write Operation>

Figure 3:
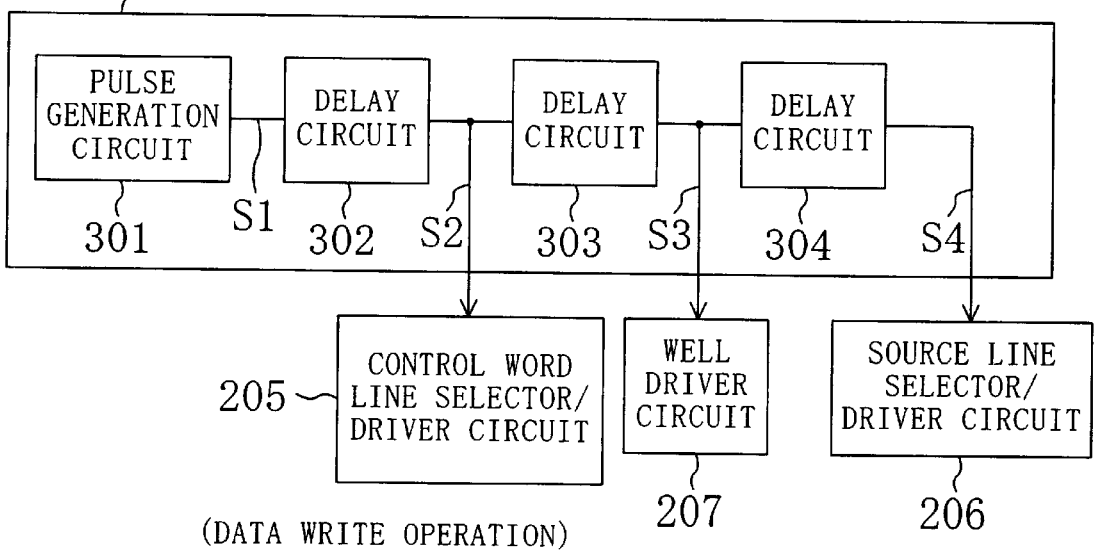
FIG. 3 is a block diagram of a timing control circuit employed in writing data.

FIG. 3 is a block diagram for showing the architecture of the timing control circuit 202, and more particularly, a timing control circuit 202A employed in writing data.

Figure 10:
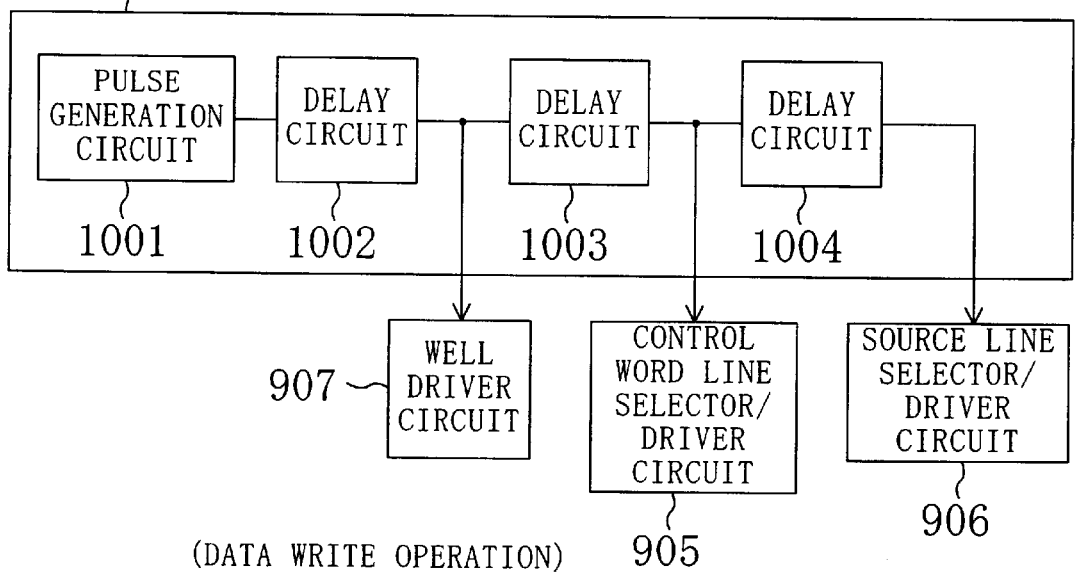
FIG. 10 is a block diagram of a conventional timing control circuit employed in writing data.

The timing control circuit 202A of FIG. 3 includes a pulse generation circuit 301 (corresponding to a first pulse generation circuit) for generating a desired write pulse signal S1 from a basic clock, and delay circuits 302, 303 and 304 for outputting delay signals for providing predetermined delays respectively to the activations of the aforementioned selector/deriver circuits 205, 207 and 206. Also, as shown in FIG. 3, the control word line selector/deriver circuit 205 is connected to the timing control circuit 202A so as to receive a delay signal S2 (corresponding to a first delay signal) from the delay circuit 302, the well driver circuit 207 is connected thereto so as to receive a delay signal S3 (corresponding to a second delay signal) from the delay circuit 303, and the source line selector/deriver circuit 206 is connected thereto so as to receive a delay signal S4 (corresponding to a third delay signal) from the delay circuit 304. Therefore, when the timing control circuit 202A of FIG. 3 is employed, the order of starting activating the control word line selector/deriver circuit 205 and the well driver circuit 207 is reverse to that attained when the conventional timing control circuit 902A of FIG. 10 is used.

In a data write operation, first, the control word line selector/deriver circuit 205 having received the delay signal S2 is activated with the predetermined delay from the write pulse signal S1, so as to apply a predetermined voltage to the control word line for changing its potential. Then, the well driver circuit 207 having received the delay signal S3 is activated with the predetermined delay from the delay signal S3, so as to apply a predetermined voltage to the P well 106 for changing its potential. Furthermore, the source line selector/deriver circuit 206 having received the delay signal S4 is activated with the predetermined delay from the delay signal S4, so as to apply a predetermined voltage to the source line for changing its potential. In this manner, data is written in the memory cell 10.

Figure 4:
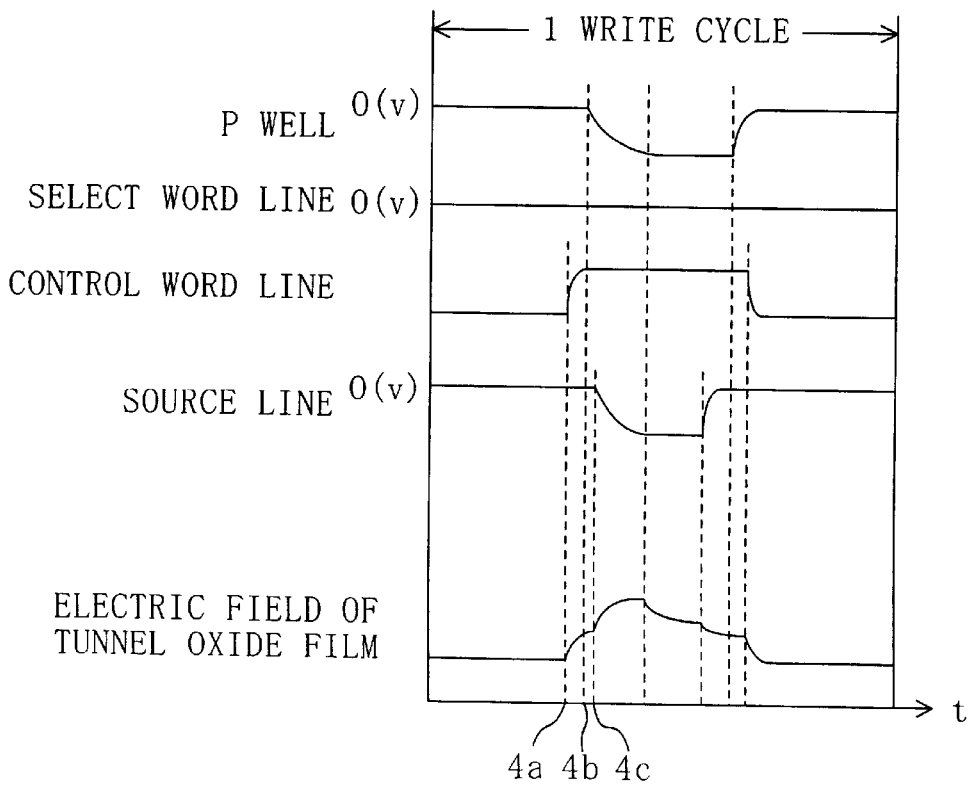
FIG. 4 is a diagram for showing operation timings and polarities of respective signal lines employed in writing data.

FIG. 4 is a diagram for showing operation timings and polarities of the respective signal lines employed in writing data in the memory cell 10, namely, in injecting electrons into the floating gate 101 via the tunnel oxide film 102. Also, FIG. 4 shows the order of applying the voltages to the memory cell 10 in writing data.

First, positive potential is applied to the control word line at timing 4*a* for changing its potential (which procedure corresponds to a first step), and subsequently, negative potential is applied to the P well 106 at timing 4*b* for changing its potential (which procedure corresponds to a second step), and thereafter, negative potential is applied to the source line at timing 4c for changing its potential (which procedure corresponds to a third step). In this case, the select word line is kept at 0 V.

Figure 12:
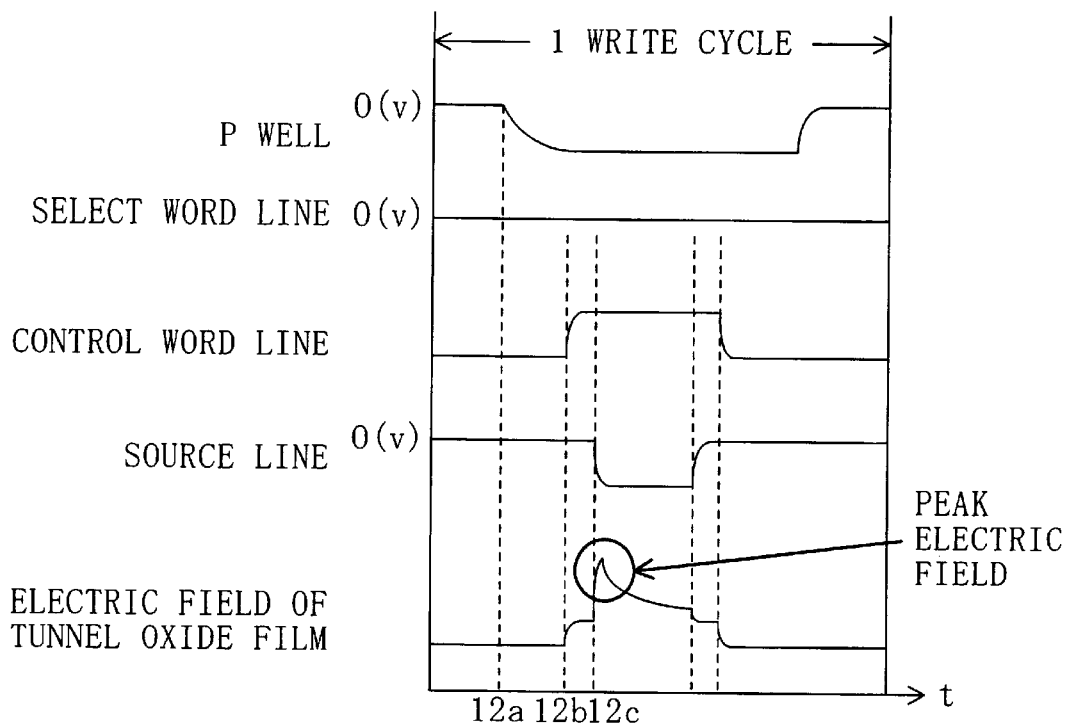
FIG. 12 is a diagram for showing operation timings and polarities of respective signal lines employed in writing data in the conventional memory cell.

When such a data write operation is employed, the electric field applied to the tunnel oxide film 102 is gradually increased during time required for charging the P well 106 as shown in FIG. 4, and therefore, the conventional peak electric field as shown in FIG. 12 can be avoided. It is noted that the electrons are being injected into the floating gate 101 also during this time and hence a write cycle time is not increased.

Furthermore, although there is an interval between the starting time for changing the potential of the P well 106 (namely, the timing 4b) and the starting time for changing the potential of the source line (namely, the timing 4c) in FIG. 4, the present invention can be similarly practiced also in the case where the potential of the P well 106 and the potential of the source line are simultaneously changed.

<Data Erase Operation>

Figure 5:
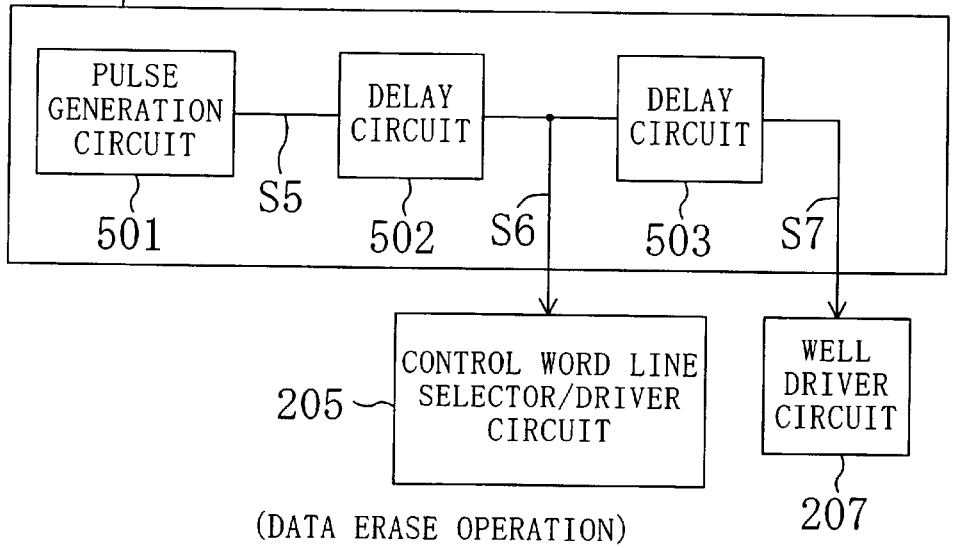
FIG. 5 is a block diagram of a timing control circuit employed in erasing data.

FIG. 5 is a block diagram for showing the architecture of the timing control circuit 202, and more particularly, a timing control circuit 202B employed in erasing data.

Figure 11:
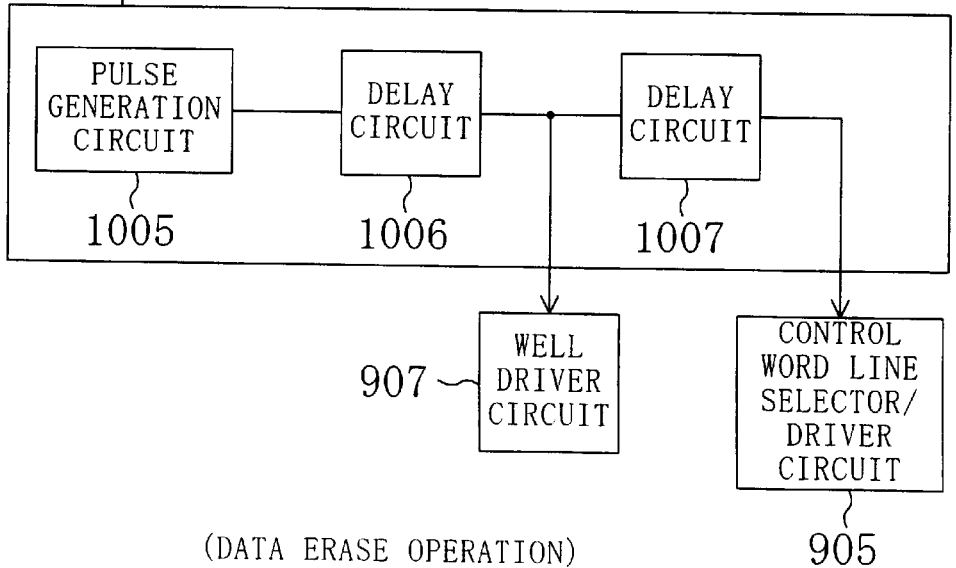
FIG. 11 is a block diagram of a conventional timing control circuit employed in erasing data.

The timing control circuit 202B of FIG. 5 includes a pulse generation circuit 501 (corresponding to a second pulse generation circuit) for generating a desired erase pulse signal S5 from a basic clock, and delay circuits 502 and 503 for outputting delay signals for providing predetermined delays respectively to the activations of the aforementioned selector/deriver circuits 205 and 207. Also, as shown in FIG. 5, the control word line selector/deriver circuit 205 is connected to the timing control circuit 202B so as to receive a delay signal S6 (corresponding to a fourth delay signal) from the delay circuit 502, and the well driver circuit 207 is connected thereto so as to receive a delay signal S7 (corresponding to a fifth delay signal) from the delay circuit 503. Therefore, when the timing control circuit 202B of FIG. 5 is employed, the order of starting activating the control word line selector/deriver circuit 205 and the well driver circuit 207 is reverse to that attained when the conventional timing control circuit 902B of FIG. 11 is used.

In a data erase operation, first, the control word line selector/deriver circuit 205 having received the delay signal S6 is activated with the predetermined delay from the erase pulse, so as to apply a predetermined voltage to the control word line for changing its potential. Then, the well driver circuit 207 having received the delay signal S7 is activated with the predetermined delay from the delay signal S7, so as to apply a predetermined voltage to the P well 106 for changing its potential. In this manner, data is erased from the memory cell 10.

Figure 6:
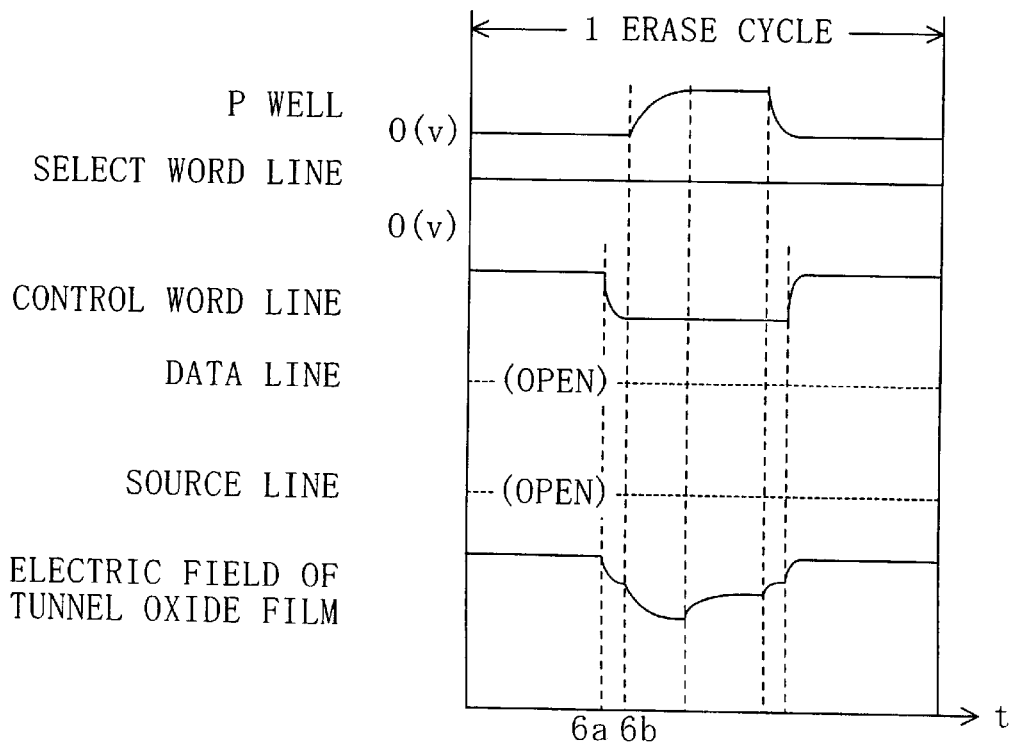
FIG. 6 is a diagram for showing operation timings and polarities of the respective signal lines employed in erasing data.

FIG. 6 is a diagram for showing operation timings and polarities of the respective signal lines employed in erasing data from the memory cell, namely, in extracting electrons from the floating gate 101. Also, FIG. 6 shows the order of applying the voltages to the memory cell 10 in erasing data.

First, negative potential is applied to the control word line at timing 6a for changing its potential (which procedure corresponds to a fourth step), and thereafter, positive potential is applied to the P well 106 at timing 6b for changing its potential (which procedure corresponds to a fifth step). In this case, the data line and the source line are opened, and the select word line is kept at power potential.

Figure 13:
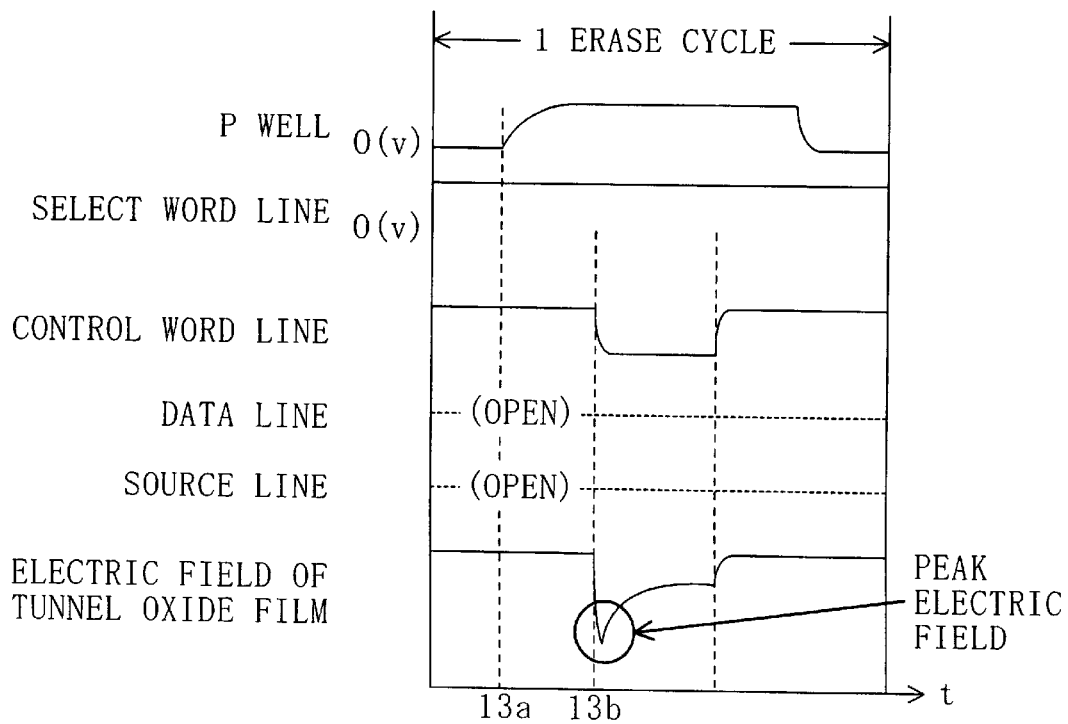
FIG. 13 is a diagram for showing operation timings and polarities of the respective signal lines employed in erasing data from the conventional memory cell.

When such a data erase operation is employed, the electric field of the tunnel oxide film 102 is gradually reduced during time required for discharging the P well 106, and therefore, the conventional peak electric field as shown in FIG. 13 can be avoided. It is noted that the electrons are being extracted from the floating gate 101 also during this time and hence an erase cycle time is not increased.

As described so far, the semiconductor memory and the method for applying a voltage to the memory cell 10 according to this embodiment have the following functions: First, in writing data, namely, in injecting electrons into the floating gate 101 of the memory cell 10, an excessive electric field such as a peak electric field can be prevented from being applied to the tunnel oxide film 102. Therefore, degradation of the tunnel oxide film 102 can be prevented, and hence, reduction of the rewrite number and degradation of the data storage characteristic can be avoided without increasing the chip size, resulting in improving the reliability. Also, in erasing data, namely, in extracting electrons from the floating gate 101, an excessive electric field such as a peak electric field can be prevented from being applied to the tunnel oxide film 102. Therefore, the degradation of the tunnel oxide film 102 can be prevented, and hence, the reduction of the rewrite number and the degradation of the data storage characteristic can be avoided without increasing the chip size, resulting in improving the reliability.

In the above-described embodiment, electrons are injected into the floating gate 101 in writing data and are extracted from the floating gate 101 in erasing data. However, there arises no problem even when electrons are extracted from the floating gate 101 for writing data and are injected into the floating gate 101 for erasing data.

Also, the delay circuits 302 and 502 can be included in the control word line selector/deriver circuit 205 and hence can be omitted for fabricating the semiconductor memory. In this case, the pulse signal S1 and the delay signal S2 are identical to each other and the pulse signal S5 and the delay signal S6 are identical to each other.

<Modification>

Figure 7:
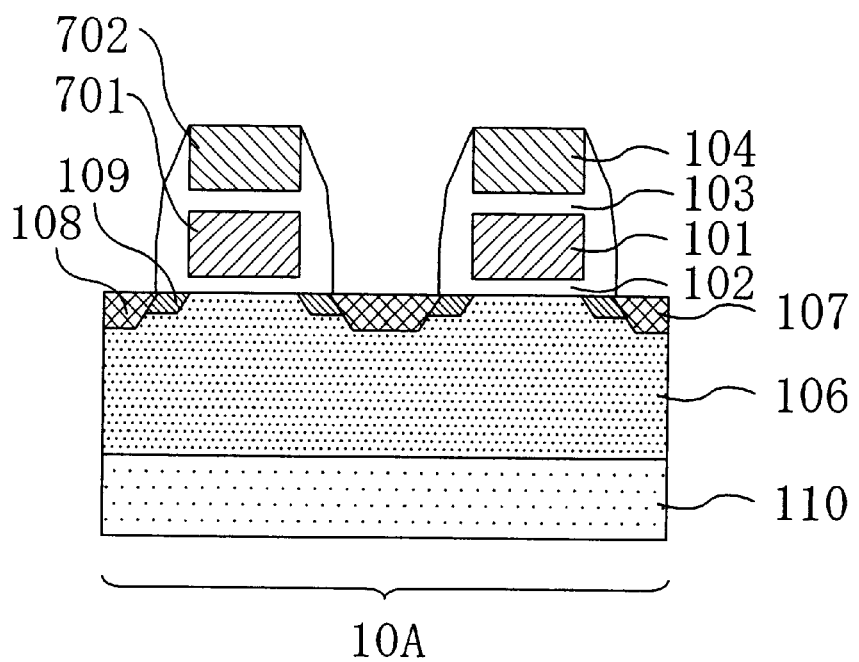
FIG. 7 is a cross-sectional view of a memory cell according to a modification of the embodiment of the invention.
Figure 8:
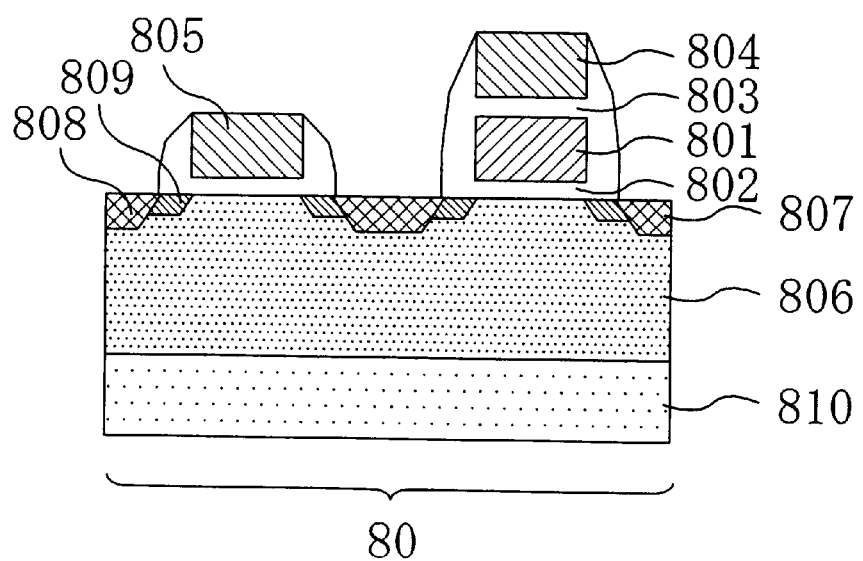
FIG. 8 is a diagram for explaining an exemplified conventional memory cell.
Figure 9:
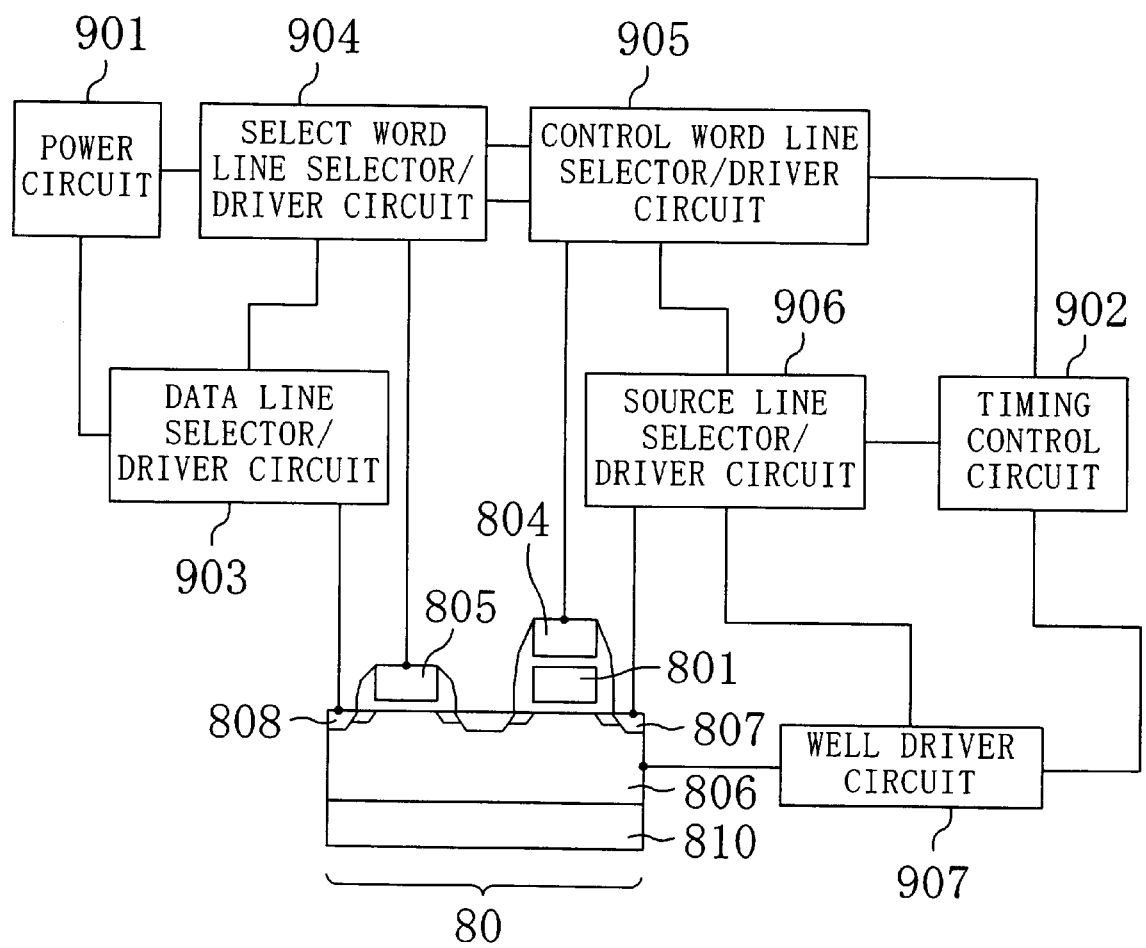
FIG. 9 is a diagram of an exemplified circuit used for operating the conventional memory cell.

FIG. 7 is a cross-sectional view of a 1-bit memory cell 10A including two transistors described as an exemplified semiconductor memory according to a modification of the embodiment.

The memory cell 10A of FIG. 7 includes a floating gate 101, a tunnel oxide film 102, an interlayer film 103 of ONO or the like, a control gate 104 connected to a control word line, a P well 106, a source 107 connected to a source line, a drain 108 connected to a data line, a thin N-type diffusion layer 109 and an N well 110. In addition, this memory cell further includes an interconnect layer 701 (corresponding to a first gate interconnect layer) and an interconnect layer 702 (corresponding to a second gate interconnect layer).

The interconnect layer 701 is the same as an interconnect layer used for the floating gate 101, and the interconnect layer 702 is the same as an interconnect layer used for the control gate 104. The interconnect layers 701 and 702 are formed simultaneously with the floating gate 101 and the control gate 104, respectively.

When these interconnect layers 701 and 702 are connected to each other, the interconnect layer 701 can be used as a gate (select word line).

Therefore, when a metal interconnect (not shown) disposed above is connected to the interconnect layers 701 and 702, the memory cell 10A of FIG. 7 can function in the same manner as the memory cell 10 of FIG. 1.

Needless to say, also when the interconnect layer 701 alone is connected to a metal interconnect (not shown) disposed above without connecting the interconnect layers 701 and 702 to each other, the memory cell 10A of FIG. 7 can function in the same manner as the memory cell 10 of FIG. 1.

In this manner, according to the semiconductor memory of this invention, an excessive electric field can be prevented from being applied to the tunnel oxide film in injecting electrons into the floating gate of the semiconductor memory device. Therefore, the degradation of the tunnel oxide film can be avoided, so that the reduction of the rewrite number and degradation of the data storage characteristic can be avoided without increasing the chip size. Accordingly, the semiconductor memory of this invention can be further improved and application of nonvolatile memories are further increased, and thus, the present invention exhibits a remarkable industrial effect.

What is claimed is:

1. A semiconductor memory comprising:

a semiconductor memory device including a first transistor and a second transistor formed on a well, said first transistor having a tunnel oxide film, a floating gate, a drain, a source connected to a source line and a control gate connected to a control word line, said second transistor having a source, a drain connected to a data line and a gate connected to a select word line, and said drain of said first transistor being connected to said source of said second transistor;

a first pulse generation circuit for outputting a pulse signal in injecting electrons into said floating gate of said first transistor;

a first delay circuit for receiving said pulse signal from said first pulse generation circuit and outputting a first delay signal by delaying said pulse signal;

a second delay circuit for receiving said first delay signal from said first delay circuit and outputting a second delay signal by delaying said first delay signal;

a third delay circuit for receiving said second delay signal from said second delay circuit and outputting a third delay signal by delaying said second delay signal;

a control word line driver circuit for changing potential of said control word line to a given voltage in response to said first delay signal received from said first delay circuit;

a well driver circuit for changing potential of said well to a given voltage in response to said second delay signal received from said second delay circuit; and a source line driver circuit for changing potential of said source line to a given potential in response to said third delay signal received from said third delay circuit.

2. A semiconductor memory comprising:

a semiconductor memory device including a first transistor and a second transistor formed on a well, said first transistor having a tunnel oxide film, a floating gate, a drain, a source connected to a source line and a control gate connected to a control word line, said second transistor having a source, a drain connected to a data line and a gate connected to a select word line, and said drain of said first transistor being connected to said source of said second transistor;

a second pulse generation circuit for outputting a pulse signal in extracting electrons from said floating gate of said first transistor;

a fourth delay circuit for receiving said pulse signal from said second pulse generation circuit and outputting a fourth delay signal by delaying said pulse signal;

a fifth delay circuit for receiving said fourth delay signal from said fourth delay circuit and outputting a fifth delay signal by delaying said fourth delay signal;

a control word line driver circuit for changing potential of said control word line to a given voltage in response to said fourth delay signal received from said fourth delay circuit; and a well driver circuit for changing potential of said well to a given voltage in response to said fifth delay signal received from said fifth delay circuit.

3. The semiconductor memory of claim 1 or 2, wherein said gate of said second transistor is a first gate interconnect layer that is formed simultaneously with and from an identical interconnect layer with said floating gate of said first transistor.

4. The semiconductor memory of claim 1 or 2, wherein said gate of said second transistor is obtained by connecting a first gate interconnect layer to a second gate interconnect layer, said first gate interconnect layer being formed simultaneously with and from an identical interconnect layer with said floating gate of said first transistor, and said second gate interconnect layer being formed simultaneously with and from an identical interconnect layer with said control gate of said first transistor.

5. A method for applying a voltage to a semiconductor memory device, said semiconductor memory device including a first transistor that is formed on a well and has a tunnel oxide film, a floating gate, a drain, a source connected to a source line and a control gate connected to a control word line; and a second transistor that is formed on said well and has a source, a drain connected to a data line and a gate connected to a select word line, said drain of said first transistor being connected to said source of said second transistor, said method comprising, for injecting electrons into said floating gate of said first transistor:

a first step of changing potential of said control word line to a given voltage;

a second step of changing potential of said well to a given voltage after changing the potential of said control word line in the first step; and a third step of changing potential of said source line to a given voltage after changing the potential of said well in the second step.

6. A method for applying a voltage to a semiconductor memory device, said semiconductor memory device including a first transistor that is formed on a well and has a tunnel oxide film, a floating gate, a drain, a source connected to a source line and a control gate connected to a control word line; and a second transistor that is formed on said well and has a source, a drain connected to a data line and a gate connected to a select word line, said drain of said first transistor being connected to said source of said second transistor, said method comprising, for extracting electrons from said floating gate of said first transistor:

a first step of changing potential of said control word line to a given voltage; and a second step of changing potential of said well to a given voltage after changing the potential of said control word line in the fourth step.

* * * * *